(12) United States Patent
Tan et al.

(10) Patent No.: US 8,673,692 B2
(45) Date of Patent: Mar. 18, 2014

(54) CHARGING CONTROLLED RRAM DEVICE, AND METHODS OF MAKING SAME

(75) Inventors: Shyue Seng Tan, Singapore (SG); Tu Pei Chen, Singapore (SG)

(73) Assignees: GLOBALFOUNDRIES Singapore PTE Ltd., Singapore (SG); Nanyang Technological University, Singapore (SG)

( * ) Notice: Subject to any disclaimer, the term of this patent is extended or adjusted under 35 U.S.C. 154(b) by 12 days.

(21) Appl. No.: 13/353,922

(22) Filed: Jan. 19, 2012

(65) Prior Publication Data

US 2013/0187109 A1    Jul. 25, 2013

(51) Int. Cl.
*H01L 21/00* (2006.01)
*H01L 21/82* (2006.01)
*H01L 21/84* (2006.01)

(52) U.S. Cl.
USPC ............... 438/128; 438/166; 438/95; 257/1; 257/2; 257/3; 257/4; 257/5

(58) Field of Classification Search
USPC ........ 257/1–5; 438/95, 128; 365/45, 148, 163
See application file for complete search history.

(56) References Cited

U.S. PATENT DOCUMENTS

| | | | |
|---|---|---|---|
| 6,531,371 B2 | 3/2003 | Hsu et al. | 438/385 |
| 6,867,996 B2 | 3/2005 | Campbell et al. | 365/100 |
| 6,870,755 B2 | 3/2005 | Rinerson et al. | 365/148 |
| 6,946,702 B2 | 9/2005 | Jang | 257/306 |
| 7,067,865 B2 | 6/2006 | Lung | 257/296 |
| 7,157,750 B2 | 1/2007 | Bulovic et al. | 257/200 |
| 7,292,469 B2 | 11/2007 | Lee et al. | 365/163 |
| 7,569,844 B2 | 8/2009 | Lung | |
| 7,606,055 B2 | 10/2009 | Liu | |
| 7,786,461 B2 | 8/2010 | Lung | |
| 7,875,493 B2 | 1/2011 | Lung | |
| 7,956,344 B2 | 6/2011 | Lung | |
| 8,115,586 B2 | 2/2012 | Hosoi et al. | |
| 8,174,865 B2 | 5/2012 | Rhie et al. | |
| 8,183,126 B2 | 5/2012 | Lee et al. | |
| 2002/0017657 A1* | 2/2002 | Coffa et al. | 257/200 |
| 2007/0066014 A1* | 3/2007 | Park et al. | 438/257 |
| 2012/0074374 A1 | 3/2012 | Jo | |

OTHER PUBLICATIONS

Deng et al., "Salicidation process using NiSi and its device application," *J. Appl. Phys.*, 81:8047-51, 1997.

Gambino and Colgan, "Silicides and ohmic contacts," *Materials Chemistry and Physics*, 52:99-146, 1998.

(Continued)

*Primary Examiner* — Shouxiang Hu
*Assistant Examiner* — Cory Eskridge
(74) *Attorney, Agent, or Firm* — Amerson Law Firm, PLLC

(57) ABSTRACT

Disclosed herein is a novel charging controlled RRAM (Resistance Random Access Memory), and various methods of making such a charging controlled RRAM device. In one example, a device disclosed herein includes a first word line structure formed above a substrate, wherein the first word line structure includes a gate electrode and a nano-crystal containing layer of insulating material, a second word line structure formed above the substrate, wherein the second word line structure comprises a gate electrode and a nano-crystal containing layer of insulating material, a first implant region formed in the substrate proximate the first word line structure, wherein the first implant region defines a first bit line, and a second implant region formed in the substrate proximate the second word line structure, wherein the second implant region defines a second bit line.

6 Claims, 8 Drawing Sheets

(56) References Cited

OTHER PUBLICATIONS

Koshida et al., "Field-induced functions of porous Si as a confined system," *J. of Luminescence*, 80:37-42, 1999.

Liu et al., "Observation of Switching Behaviors in Post-Breakdown Conductions in NiSi-gated Stacks," IEDM09:135-138, 2009.

Ma et al., "Nonvolatile electrical bistability of organic/metal-nanocluster/organic system," *Applied Physics Letters*, 82:1419-21, 2003.

Raghavan et al., "Unipolar recovery of dielectric breakdown in fully silicided high-k gate stack devices and its reliability implications," *Applied Physics Letters*, 96:142901, 2010.

Rozenberg et al., "Nonvolatile Memory with Multilevel Switching: A Basic Model," *Physical Review Letters*, 92:178302, 2004.

Sakamoto et al., "Nanometer-scale switches using copper sulfide," *Applied Physics Letters*, 82:3032-34, 2003.

Terabe et al., "Ionic/electronic mixed conductor tip of a scanning tunneling microscope as a metal atom source for nanostructuring," *Applied Physics Letters*, 80:4009-11, 2002.

Chindalore et al., "Embedded Split-Gate Flash Memory with Silicon Nanocrystals for 90nm and Beyond," *2008 Symposium on VLSI Technology Digest of Technical Papers*, pp. 136-137, 2008.

Chiu et al., "A Low Store Energy, Low VDDmin, Nonvolatile 8T2R SRAM with 3D Stacked RRAM Devices for Low Power Mobile Applications," *2010 Symposium on VLSI Circuits/Technical Digest of Technical Papers*, pp. 229-230, 2010.

Kuegeler et al., "Materials, technologies, and circuit concepts for nanocrossbar-based bipolar RRAM," *Appl. Phys. A*, 102:791-809, 2011.

Lee et al., "2-stack 1D-1R Cross-point Structure with Oxide Diodes as Switch Elements for High Density Resistance RAM Applications," *2007 IEEE*, pp. 771-774, 2007.

Russo et al., "Filament Conduction and Reset Mechanism in NiO-Based Resistive-Switching Memory (RRAM) Devices," *IEEE Transactions on Electron Devices*, 56:186-192, 2009.

Sekar, "IEEE SCV EDS Technical Events, Nov. 16, 2010, Resistive RAM: Technology and Market Opportunities" Presentation, 2010.

Shimizu et al., "A Novel High-Density $5F^2$ NAND STI Cell Technology Suitable for 256Mbt and 1Gbit Flash Memories," *1997 IEEE*, pp. 97-271-97-274, 1997.

Tseng et al., "High Density and Ultra Small Cell Size of Conctact ReRAM (CR-RAM) in 90nm CMOS Logic Technology and Circuits," *2009 IEEE*, pp. 09-109-09-112, 2009.

Tsunoda et al., "Low Power and High Speed Switching of Ti-doped NiO ReRAM under the Unipolar Voltage Source of less than 3 V," *2007 IEEE*, pp. 767-770, 2007.

Wei et al., "Highly Reliable $TaO_x$ ReRAM and Direct Evidence of Redox Reaction Mechanism," *2008 IEEE*, pp. 293-296, 2008.

Whang et al., "Novel 3-Dimensional Dual Control-Gate with Surrounding Floating-Gate (DC-SF) NAND Flash Cell for 1Tb File Storage Application," *2010 IEEE*, pp. 10-668-10-671, 2010.

\* cited by examiner

CHARGING CONTROLLED RRAM DEVICE, AND METHODS OF MAKING SAME

BACKGROUND OF THE INVENTION

1. Field of the Invention

Generally, the present disclosure relates to sophisticated semiconductor devices and the manufacturing of such devices, and, more specifically, to a novel charging controlled RRAM (Resistance Random Access Memory) device, and various methods of making such a charging controlled RRAM device.

2. Description of the Related Art

As is well known to those skilled in the art, non-volatile memory (NVM) devices are characterized in that there is no loss of data stored in their memory cells, even when an external power supply is removed. For that reason, such non-volatile memory devices are widely employed in computers, mobile communication systems, memory cards and the like.

Flash memory structures are widely used in such non-volatile memory applications. The typical flash memory device employs memory cells having a stacked gate structure. The stacked gate structure typically includes a tunnel oxide layer, a floating gate, an inter-gate dielectric layer and a control gate electrode, which are sequentially stacked above a channel region. While flash memory structures have enjoyed enormous success, the continued and ever-present drive to reduce the size of integrated circuit products has created many challenges for the continued scaling of flash memory devices. Such challenges include scaling of program/erase voltages, access speed, reliability, the number of charges stored per floating gate, etc.

A resistance random access memory (RRAM) device is a simple two-terminal device memory device comprised of two spaced-apart electrodes with a variable resistance material layer or ion conductor layer positioned between the two electrodes. The variable resistance material layer is typically comprised of various metal oxides, such as nickel oxide, titanium oxide, zirconium oxide, copper oxide, aluminum oxide, etc. The variable resistance material layer is used as a data storage layer. The resistance of the variable resistance material layer may be varied or changed based upon the polarity and/or amplitude of an applied electric pulse. The electric field strength or electric current density from the pulse, or pulses, is sufficient to switch the physical state of the materials so as to modify the properties of the material and establish a highly localized conductive filament (CF) in the variable resistance material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity or pulses having a different amplitude from those used to induce the initial change.

In general, after an RRAM device is initially fabricated, the variable resistance material layer does not exhibit any switching properties. Rather, a so-called FORMING process, a high-voltage, high-current process, is performed to initially form the localized conductive filament with oxygen vacancies from the cathode, establishing a low-resistance state (LRS) exhibiting a relatively high current flow. A so-called RESET process is performed to break the conductive filament and establish a high-resistance state (HRS) exhibiting a relatively low current flow. This RESET process is typically a current-driven thermal process that causes the conductive filament to be broken by a heat-assisted chemical reaction. More specifically, the conductive filament is broken due to the fact that a high current is passing through an ultra-thin (a few nanometers) conductive filament causing a high current density which leads to high temperatures and a melting down of the conductive filament. Note that the RESET process removes only a portion of the entire length of the conductive filament, i.e., the RESET process does not remove the entire conductive filament. After a RESET process is performed, a so-called SET process is performed to reestablish the conductive filament and thus the low-resistance state of the charging controlled RRAM device. The SET process is essentially the same as the FORMING process except that the SET process is performed at a lower voltage than the FORMING process since the filament length to be reestablished is shorter than the length of the conductive filament that was formed during the FORMING process.

One problem associated with a traditional RRAM device is the relatively high power required to initially form the localized conductive filament in the variable resistance material layer during the FORMING process. For example, in some current-day RRAM devices, it may take up to approximately 0.2 W of power to initially form the conductive filament. Such a large power requirement for forming the conductive filament is not only wasteful, it is highly incompatible with the scaling of semiconductor devices, such as those employing CMOS technology, and particularly in mobile applications, such as cell phones and the like, where power conservation and battery life is a very important consideration. It is believed that this requirement of a relatively high power to form the conductive filament in an RRAM device has limited the widespread adoption of RRAM devices in integrated circuit products.

One example of a well-established non-volatile memory product is so-called Flash memory devices. Flash memory devices have been in widespread use since their development in the 1990's. In general, a Flash memory cell is comprised of two gates—a floating gate (typically polysilicon) and a control gate positioned above the floating gate. The floating gate is formed above a gate insulation layer (typically silicon dioxide) and a so-call tunnel oxide layer is formed between the floating gate and the control gate. In general, a charge is stored on the floating gate and the presence or absence of such a charge is indicative of two distinct states that may be employed as a memory device. One of the states may be associated with a logical "high" state (a "1"), while the other state may be associated with a logical "low" state (a "0"). The ability of a Flash memory device to store electrical charge on the floating gate is due to the inherent energy barrier (about 3.2 eV) between the polysilicon floating gate and the silicon dioxide gate insulation layer. Because of this high energy barrier, programming and erasing a Flash memory device involves relatively high voltages. Over the years, Flash memory devices have been greatly reduced in size or scaled due to a variety of factors, such as, for example, improvements in photolithography tools and techniques, and the use of various so-called self-alignment manufacturing techniques. However, reduction of the physical size of the typical Flash memory device is limited by the electrical operational characteristics of the device. For example, to achieve hot-carrier programming, a voltage of about 4V is typically required to overcome the silicon-silicon dioxide barrier energy level of about 3.2V. A Flash memory device with a channel length that is too short (e.g., less than about 70 nm) may not be able to withstand the required programming voltage that is necessary to operate a traditional Flash memory device. Alternative materials for the gate insulation layer may also help with further device scaling of Flash memory devices, but the development in that area has not been as successful as would otherwise be desired. An additional area that may be problematic in scaling Flash memory devices involves the tunnel oxide layer. In general, there must be sufficient capacitive coupling between the floating gate and the control gate so that the erase voltage can be kept as low as possible. Scaling of a Flash memory device requires that the tunnel oxide layer be reduced in thickness to maintain the desired degree of capacitive coupling between the floating gate and the control gate. Current memory devices have employed various materials or combinations of material (such as an oxide-nitride-oxide tunnel oxide) that meet today's requirements. However, as device dimensions continue to shrink, it remains to be seen whether or not the industry can continue to provide tunnel oxide layers that enable the desired level of capacitive coupling between the floating gate and the control gate.

Recently, another type of a two-terminal RRAM device has been observed that employs nano-crystals embedded in a layer of silicon dioxide. With respect to such a device, it has been observed that by charging (programming) and discharging (erasing) nano-crystals into a capacitor structure (via Fowler-Nordheim tunneling), the gate current conduction may be modulated. Each gate conduction state is well defined and represents a potential memory state. During charging (electron trapping) and discharging (electron de-trapping and/or hole trapping) causes, respectively, a reduction and enhancement in the current conduction, where the current conduction is due to electron transport. However, the two-terminal device has little appeal as it relates to current-day memory devices where high densities are required.

The present disclosure is directed to a novel charging controlled RRAM device, and various methods of making such an RRAM device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to a novel charging controlled RRAM (Resistance Random Access Memory), and various methods of making such an RRAM device. In one example, a device disclosed herein includes a first word line structure formed above a substrate, wherein the first word line structure includes a gate electrode and a nano-crystal containing layer of insulating material, a second word line structure formed above the substrate, wherein the second word line structure comprises a gate electrode and a nano-crystal containing layer of insulating material, a first implant region formed in the substrate proximate the first word line structure, wherein the first implant region defines a first bit line, and a second implant region formed in the substrate proximate the second word line structure, wherein the second implant region defines a second bit line.

In another example, a method disclosed herein includes forming a first word line structure above a semiconducting substrate, forming a second word line structure above the semiconducting substrate proximate the first word line structure, forming a first implant region in the substrate proximate the first word line structure, wherein the first implant region defines a first bit line, and forming a second implant region in the substrate proximate the second word line structure, wherein the second implant region defines a second bit line.

BRIEF DESCRIPTION OF THE DRAWINGS

The disclosure may be understood by reference to the following description taken in conjunction with the accompanying drawings, in which like reference numerals identify like elements, and in which.

Figure 1A:
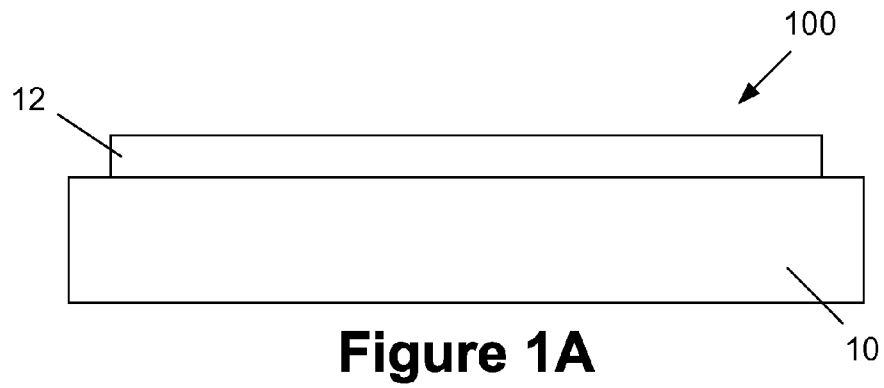
FIGS. 1A-1L depict one illustrative process flow for forming one illustrative embodiment of a novel charging controlled RRAM device disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to a novel charging controlled RRAM (Resistance Random Access Memory), and various methods of making such a charging controlled RRAM device. As will be readily apparent to those skilled in the art upon a complete reading of the present application, the device disclosed herein may be employed with a variety of technologies, e.g., NMOS, PMOS, CMOS, etc., and it may be incorporated into a variety of integrated circuit products. With reference to the attached drawings, various illustrative embodiments of the methods and devices disclosed herein will now be described in more detail. It should be understood that the various features and layers in the attached drawing may not be to scale so as to facilitate disclosure of the present inventions.

FIGS. 1A-1L depict one illustrative process flow for forming one illustrative embodiment of the novel charging controlled RRAM device 100 disclosed herein. FIG. 1A is a simplified view of one illustrative embodiment of the novel charging controlled RRAM device 100 disclosed herein at an early stage of manufacturing. The charging controlled RRAM device 100 is formed above a semiconducting substrate 10. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all semiconductor structures. The substrate 10 may also be made of materials other than silicon. The substrate 10 may be doped with an N-type dopant or a P-type dopant or it may be un-doped. In the illustrative examples depicted herein, the substrate 10 is presumed to be doped with an illustrative P-type dopant such as boron.

FIG. 1A depicts the charging controlled RRAM device 100 after a first layer of insulating material layer 12 has been formed above the substrate 10. The first layer of insulating material 12 is intended to be representative in nature as it may be a single layer of material (as depicted) or it may be a stack comprised of multiple layers of materials. As will be recognized by those skilled in the art after a complete reading of the present application, the first layer of insulating material 12 may be comprised of one or more of a variety of different materials and it may be formed using a variety of techniques. For example, the first layer of insulating material 12 may be comprised of a so-called ultra-low-k (k value less than 2.8) material, a low-k (k value less than 3) insulating material, a high-k (k value greater than 10) insulating material, silicon dioxide, silicon nitride, hafnium oxide, aluminum oxide, zirconium oxide, an oxide-nitride-oxide stack, etc., and its thickness may vary depending upon the particular application, e.g., in some cases, it may have an overall thickness of about 15-50 nm. The first layer of insulating material 12 may be formed by performing any of a variety of known processing techniques, e.g., a thermal growth process, chemical vapor deposition (CVD), atomic layer deposition (ALD), etc., or plasma-enhanced versions of such processes. In one illustrative embodiment, the first layer of insulating material 12 may be a layer of silicon dioxide that is formed by a CVD process.

Figure 1B:
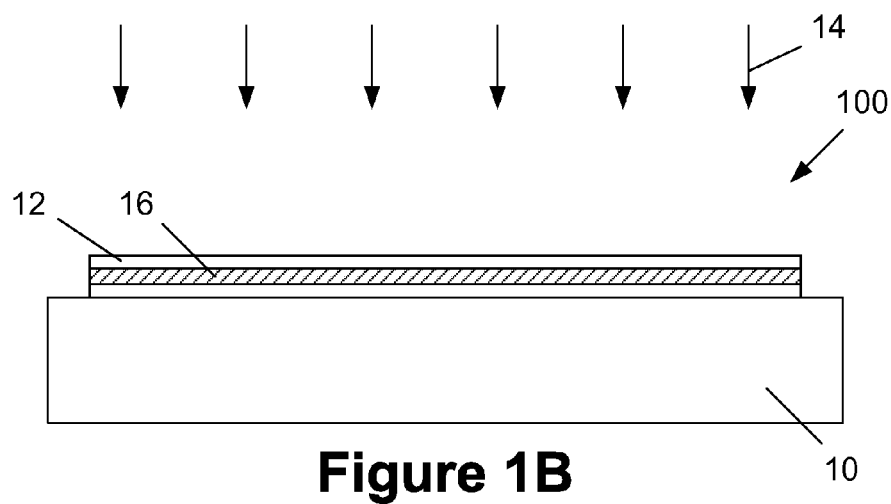

Next, as shown in FIG. 1B, a first ion implantation process 14 is performed to introduce a material 16, such as silicon, germanium or a metal (such as aluminum, tungsten, titanium, etc.) into the first layer of insulating material 12. The first ion implantation process 14 may be performed using known ion implantation tools and techniques. In one illustrative embodiment, the implant energy of the first ion implantation process 14 may be selected such that the peak concentration of the implanted materials 16 are positioned at approximately the mid-thickness position of the layer of insulating material 12. The implant dose and the implant energy of the first ion implantation process 14 may vary depending upon the particular application. For example, the implant energy may vary from about sub-keV levels to about 30 keV and the implant dose may vary from about $1\ e^{13}$-$1\ e^{16}$ ions/cm$^2$. In one particular example, the implant material 16 may be silicon.

Figure 1C:
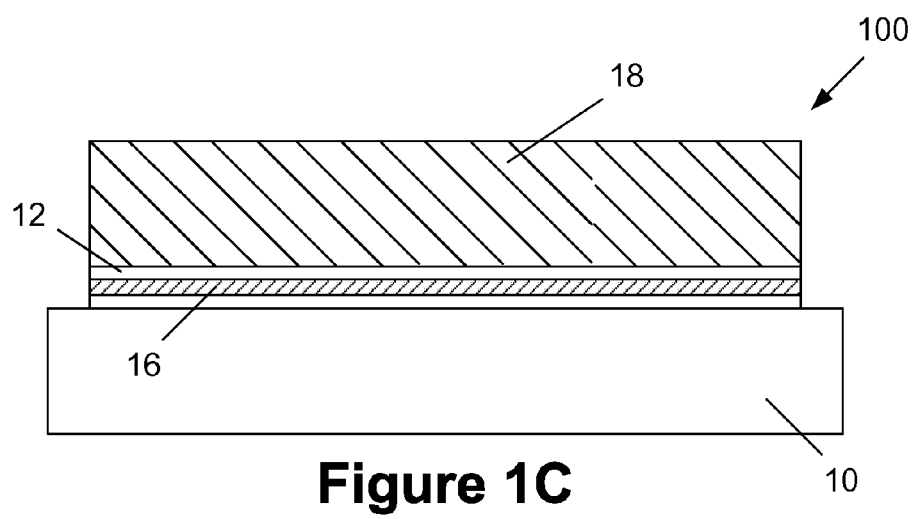

Next, as shown in FIG. 1C, a first layer of gate electrode material 18 is formed above the first layer of insulating material 12. The first layer of gate electrode material 18 may be comprised of a variety of different conductive materials, such as polysilicon, amorphous silicon, a metal or metal-containing material (e.g., aluminum, tungsten, silicon, platinum, titanium, titanium nitride, copper, gold), etc., and its thickness may vary depending upon the particular application, e.g., in some cases, it may have a thickness within the range of about 100-300 nm. The first layer of gate electrode material 18 may be formed by performing a variety of deposition processes, such as a PVD process, a CVD process, an ALD process, or plasma-enhanced versions of those processes, as well as by an electroplating or electroless deposition process, etc. In one illustrative embodiment, the first layer of gate electrode material 18 may be a layer of polysilicon that was formed by performing a CVD process.

Figure 1D:
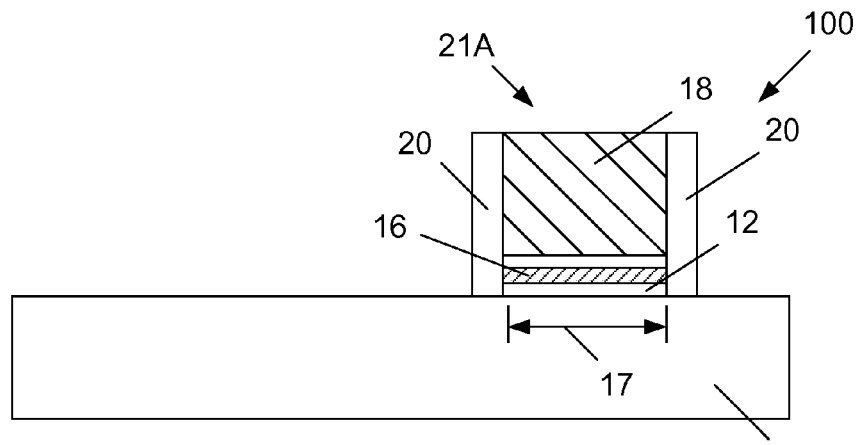

FIG. 1D, depicts the device 100 after several process operations have been performed. First, the first layer of gate electrode material 18 and the first layer of insulating material 12 are patterned to define a first gate structure 21A using traditional photolithography and etching techniques. In one illustrative embodiment, the first gate structure 21A may have a gate length 17 of about 10-100 nm. Thereafter, illustrative sidewall spacers 20 are formed adjacent the first gate structure 21A. The sidewall spacers 20 may be formed by conformably depositing a layer of spacer material, e.g., silicon nitride, and thereafter performing an anisotropic etching process. Of course, the spacers 20 may be made of other materials, such as those identified above for the first layer of insulating material 12.

Figure 1E:
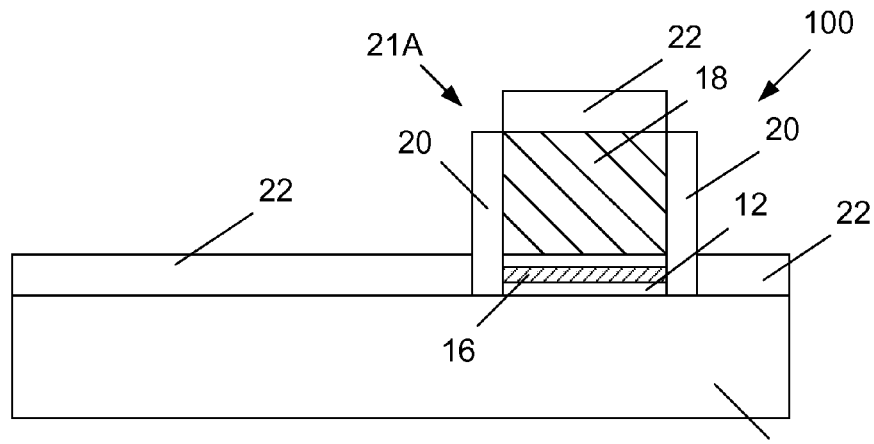

Then, as shown in FIG. 1E, a second layer of insulating material 22 is formed on the device 100. The second layer of insulating material 22 may be comprised of the same material or materials, and formed using the same techniques, as those described above for the first layer of insulating material 12. In the illustrative embodiment depicted in FIG. 1E, the second layer of insulating material 22 may be a layer of silicon dioxide that is formed by performing a thermal growth process.

Figure 1F:
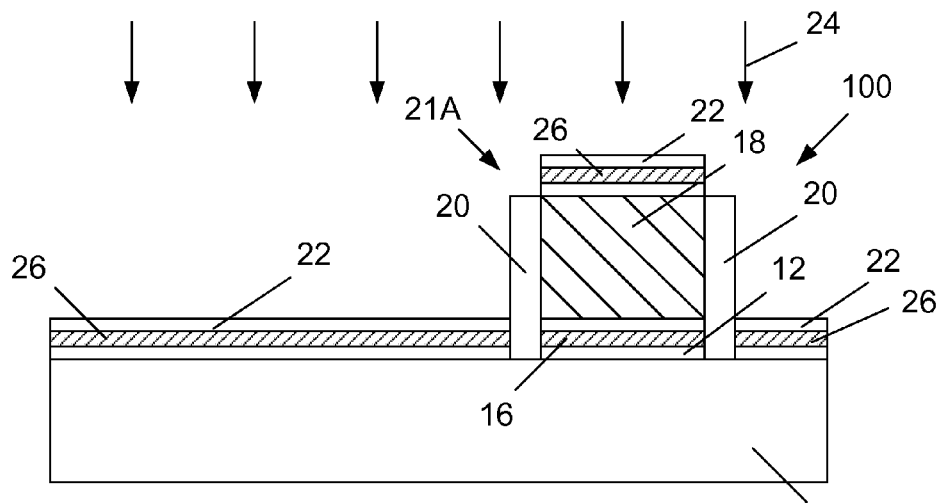

Next, as shown in FIG. 1F, a second ion implantation process 24 is performed to introduce a material 26, such as silicon, germanium or a metal, into the second layer of insulating material 22. The second ion implantation process 24 may be performed using known ion implantation tools and techniques. As with the implant energy of the first ion implantation process 14, the implant energy of the second ion implantation process 24 may be selected such that the peak concentration of the implanted materials 26 are positioned at approximately the mid-thickness position of the second layer of insulating material 22. The implant materials, implant dose and the implant energy of the second ion implantation process 24 may vary depending upon the particular application, and they may be similar to those described above with respect to the first ion implantation process 14. Of course, the first layer of insulating material 12 and the second layer of insulating material 22 need not be made of the same material or have the same thickness in all applications, although that may occur in at least some applications. Similarly, the implant materials 16, 26 and the dosage of such materials may not be the same in all applications, but that can be the case in some applications. However, in one particular embodiment, the first layer 12 and the second layer 22 may have the same thickness and the same implant dose to provide substantially uniform cell-to-cell characteristics.

Figure 1G:
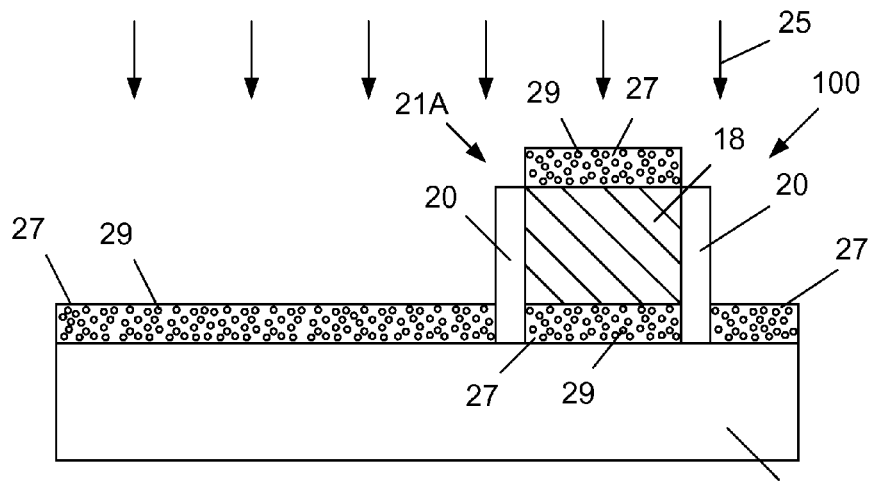

Next, as shown in FIG. 1G, a heating process 25 is performed on the device 100 to from schematically depicted nano-crystals 29 (depicted as small circles) in the first layer of insulating material 12 and the second layer of insulating material layer 22. The process creates nano-crystal containing layers of insulating material 27 for the charging controlled RRAM device 100 disclosed herein. The type of nano-crystals 29 are based upon the implanted materials 16, 26. The parameters of the heating process 25 may vary depending upon the particular application. In one illustrative embodiment, the heating process 25 may be performed at a temperature that may range from about 1050-1150° C. for a duration of about 1 second-1 hour in a nitrogen or nitrogen/oxygen ambient.

Figure 1H:
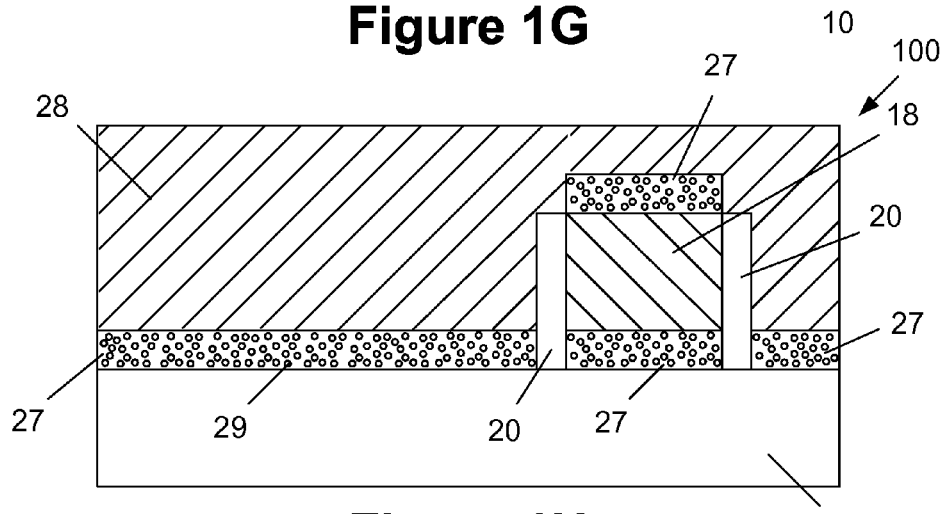

Then, as shown in FIG. 1H, a second layer of gate electrode material 28 is formed on the device 100. The second layer of gate electrode material 28 may be comprised of the same materials, and made using the same techniques, as those described above for the first layer of gate electrode material 18. Of course, the second layer of gate electrode material 28 and the first layer of gate electrode material 18 need not be made of the same material, although that may occur in at least some applications.

Figure 1I:
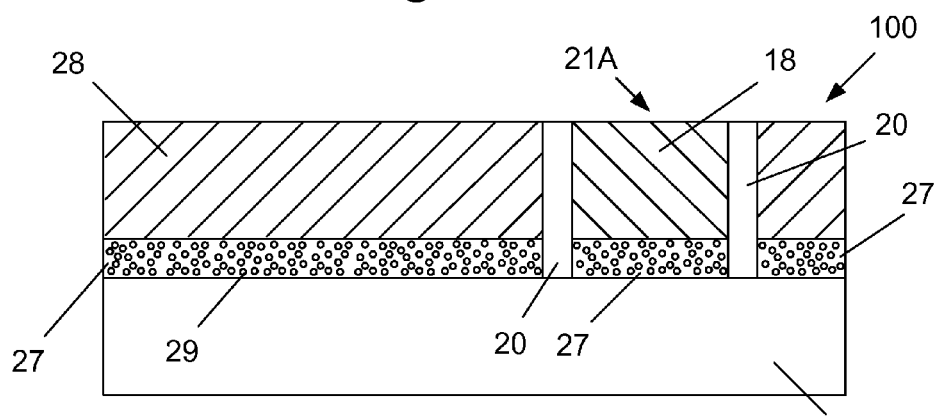

Then, as shown in FIG. 1I, a chemical mechanical polishing (CMP) process is performed to remove excess portions of the second layer of gate electrode material 28.

Figure 1J:
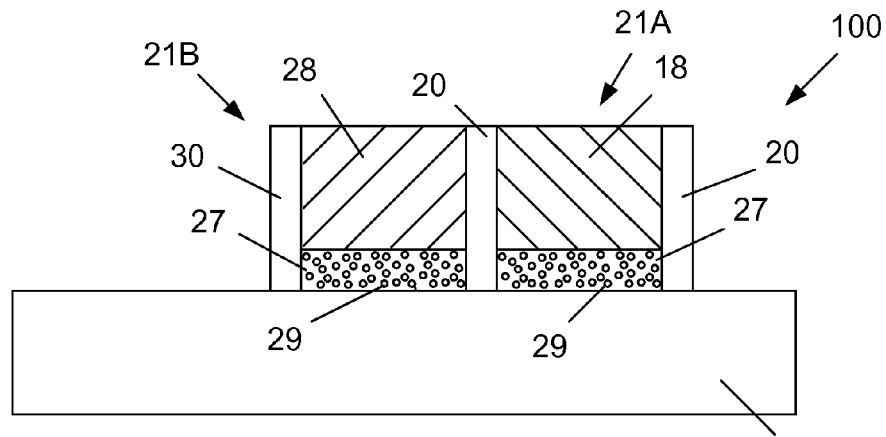
Figure 1K:
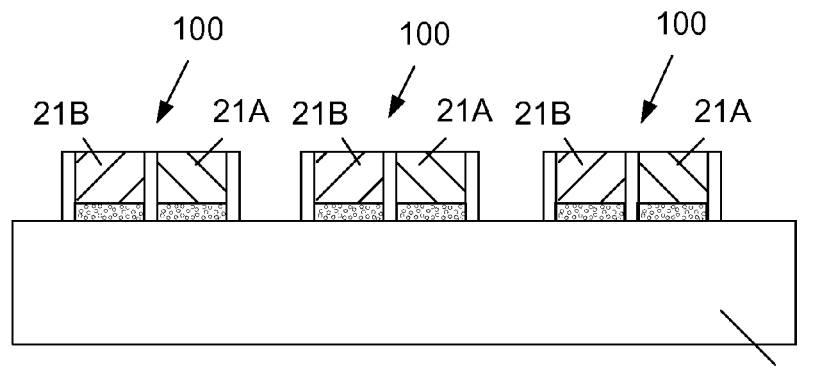

FIG. 1J depicts the device 100 after traditional photolithography and etching techniques have been performed to pattern the second layer of gate electrode material 28 and the underlying nano-crystal containing layer of insulating material 27. This process results in the definition of a second gate structure 21B comprised of the patterned second layer of gate electrode material 28 and the patterned nano-crystal containing layer of insulating material 27. The second gate structure 21B is formed adjacent the sidewall spacer 20 and proximate the first gate structure 21A. Also depicted in FIG. 1J is a sidewall spacer 30 that is formed adjacent the second gate structure 21B. The sidewall spacer 30 may be comprised of the same materials and it may be made using the same techniques as those described above for the sidewall spacer 20. During the formation of the sidewall spacer 30, a masking layer (not shown) may be positioned over part of the first gate structure 21A so as to prevent the formation of the sidewall spacer 30 proximate the first gate structure 21A. FIG. 1K simply depicts that multiple charged controlled RRAM devices 100 may be formed across the substrate 10 using the methods described herein.

Figure 1L:
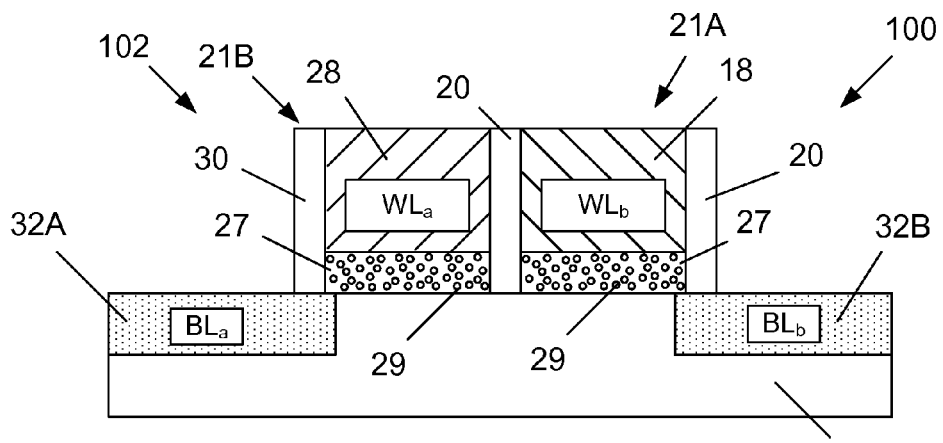

FIG. 1L depicts a substantially completed version of one illustrative embodiment of a unit cell 102 of a charge controlled RRAM device 100 disclosed herein. Of course, additional, so-called back-end-of-the-line processes will need to be performed on the device 100 to complete its fabrication. At the point of fabrication depicted in FIG. 1L, one or more ion implantation processes have been performed to introduce a dopant material (such as an N-type dopant or a P-typed dopant) into the substrate 10 to define implant regions 32A, 32B in the substrate 10. The type of dopant implanted depends upon the doping of the substrate 10. For example, when the substrate 10 is doped with a P-type dopant, an N-type dopant will be used to form the implant regions 32A, 32B. The dopant concentration in the implant regions 32A, 32B may vary depending upon the particular application. As shown in FIG. 1L, the charged controlled RRAM device 100 is comprised of first and second gate structures 21A, 21B, each comprising a nano-crystal containing layer of insulating material 27. In the illustrative unit cell 102 depicted herein, the first and second gate structures 21A, 21B of the device 100 correspond to word lines "$WL_b$" and "$WL_a$", respectively, while the implant regions 32A, 32B of the device 100 correspond to bit lines "$BL_a$" and "$BL_b$", respectively.

FIGS. 2A-2F depict various illustrative operational aspects and characteristics of the illustrative charge controlled RRAM device 100. In general, the magnitude of the current flowing through the gate structures of the device 100 can be controlled by electrically charging or discharging the nano-crystals 29 in the nano-crystal containing layer of insulating material 27.

Figure 2A:
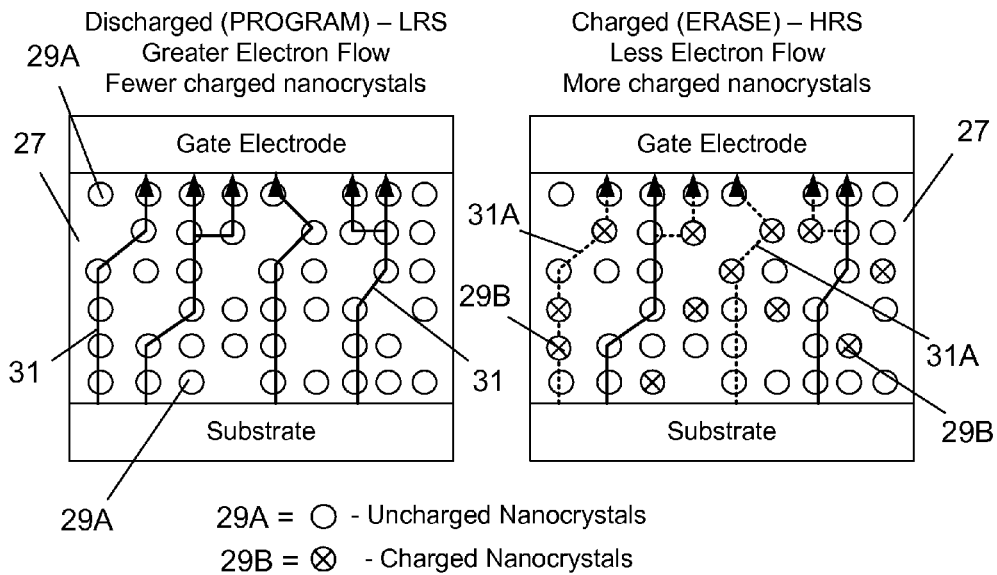
FIGS. 2A-2F depict various operational characteristics of the novel charging controlled RRAM device disclosed herein.
Figure 2E:
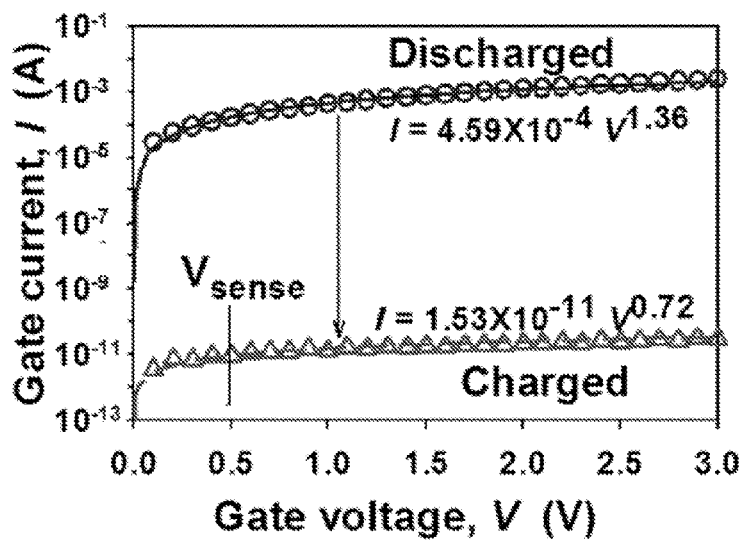

With reference to FIG. 2A, the drawing on the left represents the device in the discharged or "PROGRAM" condition wherein substantially all of nano-crystals 29 in the nano-crystal containing layer of insulating material 27 are relatively un-charged nano-crystals 29A that exhibit relatively little electrical charge. In FIG. 2A, it is assumed that the gate electrode is at a higher potential than that of the substrate. The drawing on the right in FIG. 2A represents the device 100 in the charged or "ERASE" condition when the nano-crystal containing layer of insulating material 27 contains a sufficient number of electrically charged nano-crystals 29B that exhibit a relatively higher electrical charge than do the un-charged nano-crystals 29A. In the discharge-PROGRAM condition (on the left), there are several paths for illustrative electron flow 31 through the nano-crystal containing layer of insulating material 27. That is, electron flow 31 is established as the electrons effectively "jump" from one un-charged nano-crystal 29A to an adjacent un-charged nano-crystals 29A as current flows through the nano-crystal containing layer of insulating material 27. In the charged-ERASE condition, the presence of the electrically (negatively) charged nano-crystals 29B effectively block some of the pre-established electron flow paths 31, as reflected by the dashed lines 31A. Stated another way, in the discharged-PROGRAM condition, the RRAM device is in its low-resistance state (LRS) that allows greater current flow, while in the charged-ERASE condition, the RRAM device 100 is in its high-resistance state (HRS) where there is less current flow. By charging and discharging the nano-crystals 29 in the nano-crystal containing layer of insulating material 27, the resistance of the RRAM device 100 may be changed. This change in resistance and associated differences in current levels may be used in storing bits of information on the RRAM device 100, and in reading/writing from the RRAM device 100. For example, as shown in FIG. 2E, in one illustrative example, the difference between the low-resistance state current ($I_{LRS}$) and the high-resistance state current ($I_{HRS}$) is about 7 orders of magnitude—$I_{LRS}$ is approximately $4.59 \times 10^{-4}$ A@V=1.36 volts, while $I_{HRS}$ is approximately $1.53 \times 10^{-11}$ A@V=0.72 volts. With reference to FIGS. 2A and 2F, the RRAM device 100 has two possible logic states, e.g., "logic 0" (the ERASE condition) or "logic 1" (the PROGRAM condition), that may be sensed by traditional read/write circuitry. The relative concentration of amount of un-charged nano-crystal 29A and charged nano-crystals 29B present in the layer of insulating material 27 depend upon the ERASE and PROGRAMMING condition. The measured current flowing through the RRAM device 100 is an indirect indicator of the relative concentration of the amount of un-charged nano-crystals 29A and charged nano-crystals 29B present in the layer of insulating material 27 at the time the current is measured. Based upon the above-noted relatively large difference between the low-resistance state current ($I_{LRS}$) and the high-resistance state current ($I_{HRS}$), in the PROGRAM condition, the un-charged nano-crystals 29A represent about 80-100% of all of the nano-crystals 29 in the layer of insulating material 27. In the ERASE condition, the charged nano-crystals 29B represent about 80-100% of all of the nano-crystals 29 in the layer of insulating material 27.

Figure 2B:
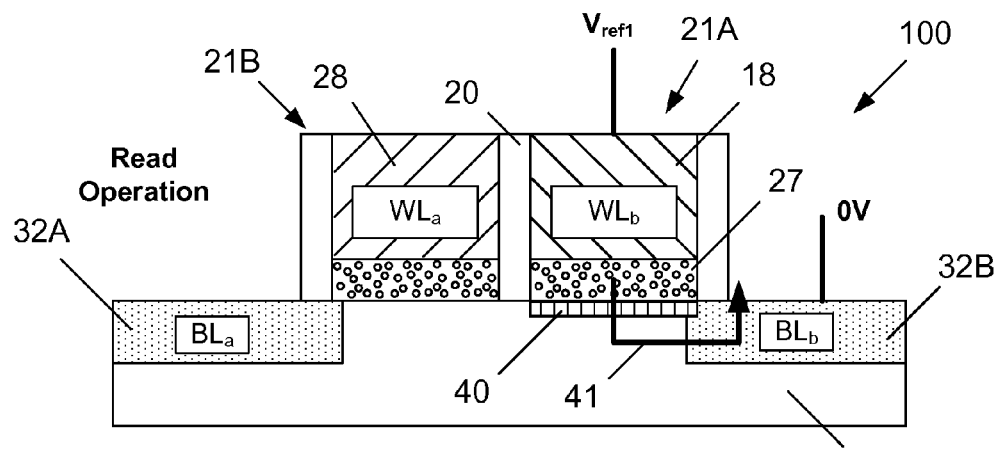
Figure 2C:
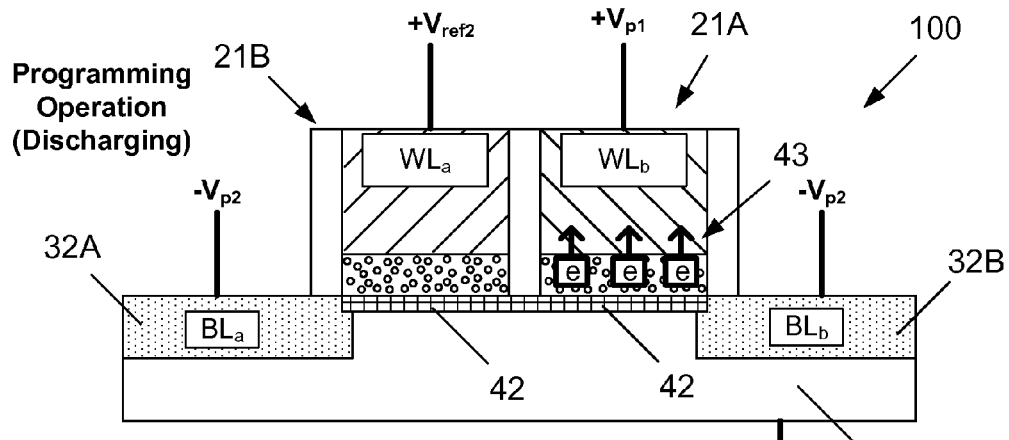
Figure 2D:
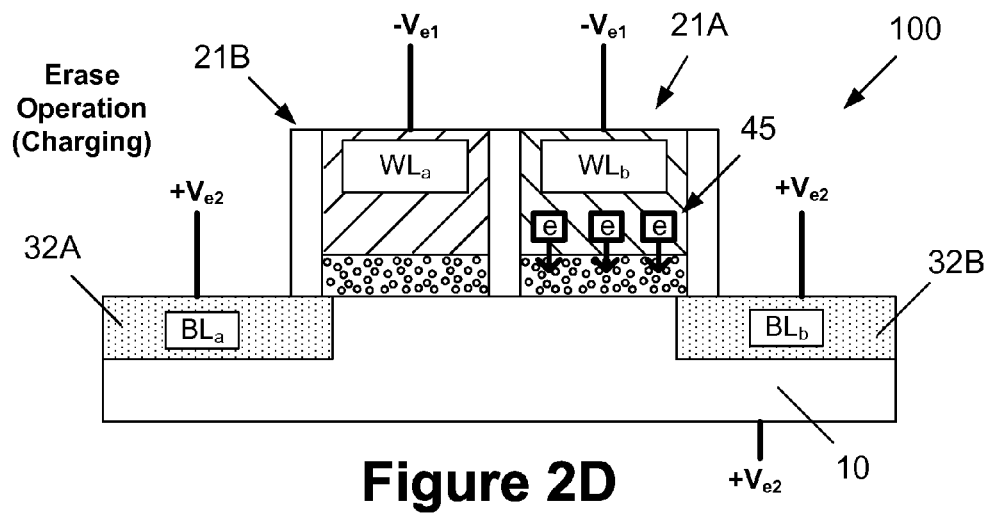
Figure 2F:
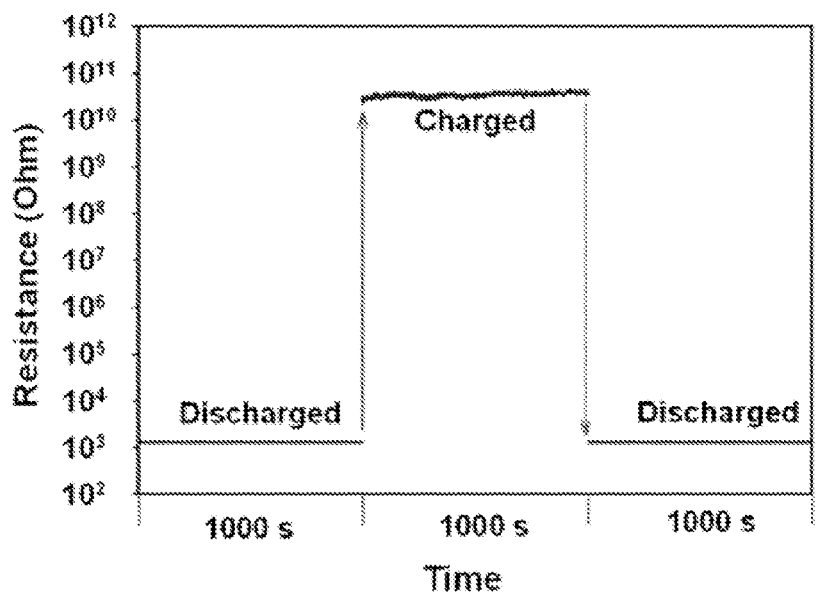

Reference will be made to FIGS. 2B, 2C and 2D to discuss further operational aspects of the illustrative charge controlled RRAM device 100 disclosed herein. FIGS. 2B, 2C and 2D depict the RRAM device 100 in illustrative examples of the "READ," "PROGRAM" and "ERASE" conditions, respectively. The illustrative RRAM device 100 disclosed herein is effectively a 5-terminal device (the two word lines, the two bit lines and the substrate or well). The table below sets forth various illustrative voltages that may be applied to the device 100 in the "READ," "PROGRAM" and "ERASE" conditions when various bit lines and word lines are selected (Sel) or unselected (Unsel).

| Oper- ation | $BL_a$ | | $BL_b$ | | $WL_a$ | | $WL_b$ | | Well |
|---|---|---|---|---|---|---|---|---|---|
| | Sel | Unsel | Sel | Unsel | Sel | Unsel | Sel | Unsel | |
| Read | F | F | 0 V | F | F | F | $V_{ref1}$ | F | NA |
| Program | $-V_{p2}$ (or 0 V) | 0 V | $-V_{p2}$ | $-V_{p2}$ (or 0 V) | $+V_{p1}$ | 0 V | $V_{ref2}$ | 0 V | $-V_{p2}$ |
| Erase | $+V_{e2}$ | $+V_{e2}$ | $+V_{e2}$ | $+V_{e2}$ | $-V_{e1}$ | $-V_{e1}$ | $-V_{e1}$ | $-V_{e1}$ | $+V_{e2}$ |

In FIG. 2B, the nano-crystal containing layers of insulating material 27 for the word lines are depicted in their low-resistance state (LRS). In the READ operation, a voltage "$V_{ref1}$" is applied to the word line $WL_b$, zero volts is applied to the bit line $BL_b$ and the other "terminals" are allowed to float. In this condition, a conductive channel or inversion layer 40 is established under the word line $WL_b$, and a read current 41 flows from the word line $WL_b$ to the bit line $BL_b$. The read current 41 may be sensed by well-known read/write sensing circuits (not shown) that are commonly employed on modern day memory devices.

FIG. 2C depicts an example of a PROGRAM operation for the device 100. In the PROGRAM operation, electrons (indicated by reference number 43) are removed from the nano-crystal containing layer of insulating material 27 associated with the word line $WL_b$. When completed, this PROGRAM action will result in the nano-crystal containing layer of insulating material 27 being in it low-resistance state (LRS) as it will contain more of the un-charged nano-crystals 29A than it does the electrically charged nano-crystals 29B. In one illustrative example, the PROGRAM condition is accomplished by applying a voltage "$+V_{p1}$" to the word line $WL_b$, a voltage $+V_{ref2}$ to the word line $WL_a$ and by applying a voltage of $-V_{p2}$ to the bit lines $BL_a$, $BL_a$ and to the substrate 10. In the PROGRAM condition, an inversion or conductive channel 42 is established under the word lines $WL_a$, $WL_b$, respectively. Once the conductive channel is formed, it will be biased at $+V_{ref2}$. Accordingly, the potential difference between $+V_{p1}$ and $-Vp_2$ is much larger than the potential difference between $+V_{ref2}$ and $-Vp_2$. Thus, the large potential difference across word line $WL_b$, and the associated large electrical field, will remove electrons from the nano-crystals in the layer of insulating material 27 by Fowler-Nordheim tunneling. On the other hand, there will be relatively little if any impact on word line $WL_a$ due to the relatively small potential difference across word line $WL_a$ ($+V_{ref2}$--$Vp_2$).

FIG. 2D depicts an example of an ERASE operation for the device 100. In the ERASE operation, electrons (indicated by reference number 45) are driven into the nano-crystal containing layer of insulating material 27 associated with the word line $WL_b$. When completed, this ERASE action will result in the nano-crystal containing layer of insulating material 27 being in its high-resistance state (HRS) as it will contain more of the electrically charged nano-crystals 29B than it does the un-charged nano-crystals 29A. In one illustrative example, the ERASE condition is accomplished by applying a voltage "$-V_{e1}$" to both of the word lines $WL_a$, $WL_b$, and by applying a voltage of $+V_{e2}$ to the bit lines $BL_a$, $BL_b$ and to the substrate 10. In the ERASE condition, there is no conductive channel established under either of the word lines $WL_a$, $WL_b$. In the ERASE condition, the potential difference across both of the word lines $WL_a$, $WL_b$ ($-V_{e1}+V_{e2}$) results in electrons from the gate being injected into the nano-crystals 29 by means of Fowler-Nordheim tunneling.

Figure 3C:
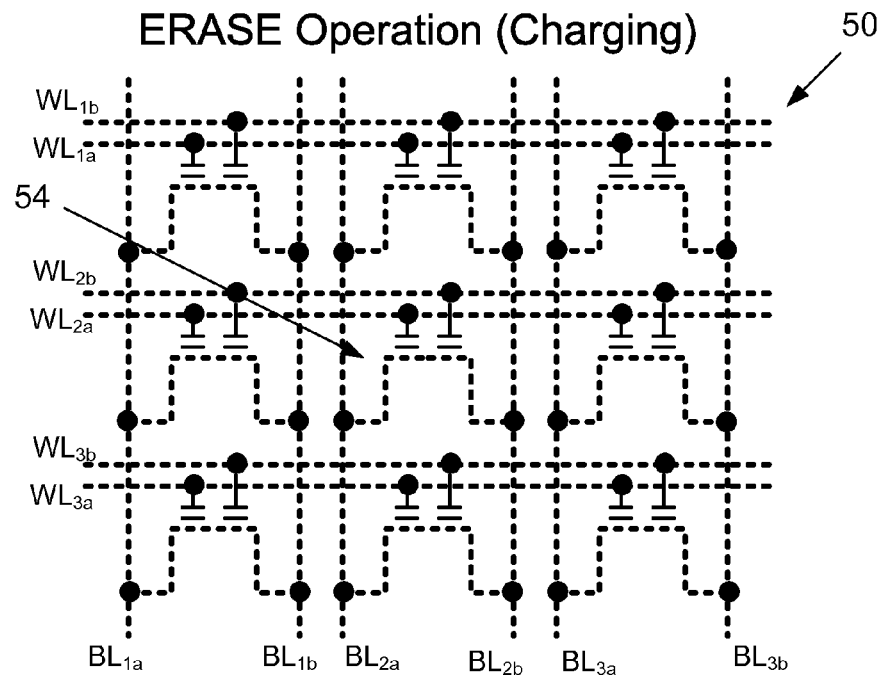
FIGS. 3A-3C are schematic depictions of an illustrative array of the novel charging controlled RRAM devices disclosed herein during a READ, PROGRAM and ERASE condition, respectively.
Figure 3A:
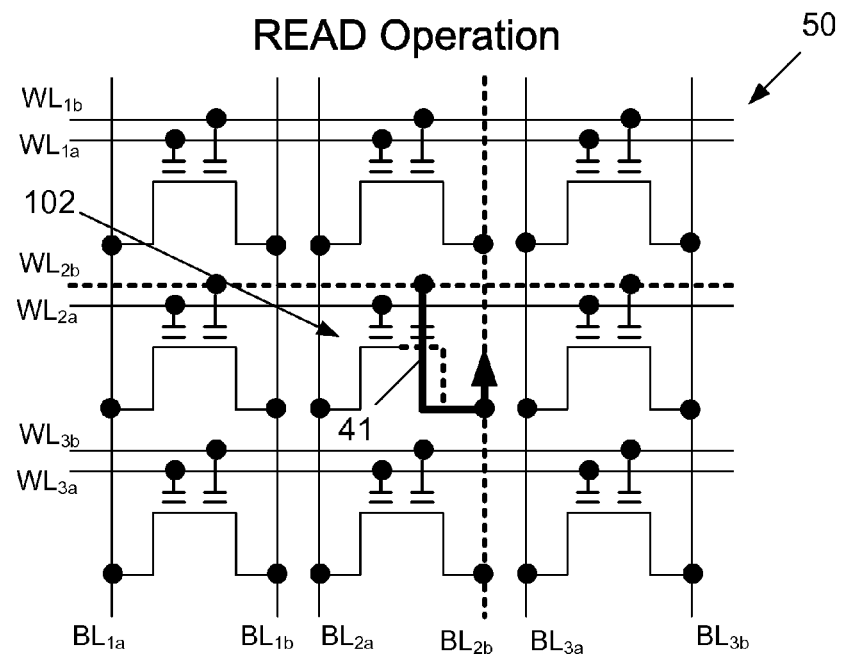
Figure 3B:
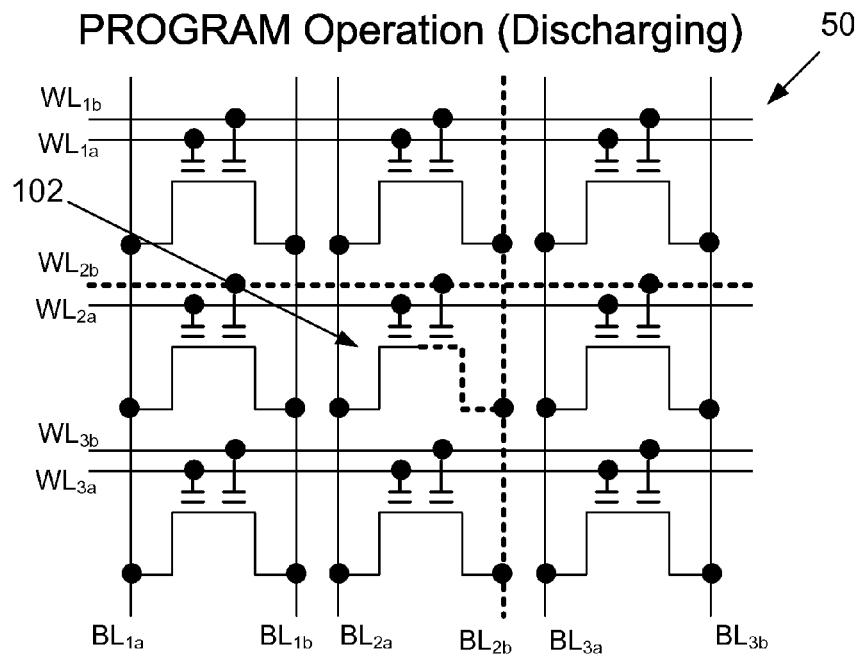

FIGS. 3A-3C are schematic depictions of an illustrative array 50 of the novel charging controlled RRAM devices 100 disclosed herein during the previously described READ, PROGRAM and ERASE operations, respectively. The array 50 is comprised of six word lines ($WL_{1a}$, $WL_{1b}$, $WL_{2a}$, $WL_{2b}$, $WL_{3a}$, $WL_{3b}$), six bit lines ($BL_{1a}$, $BL_{1b}$, $BL_{2a}$, $BL_{2b}$, $BL_{3a}$, $BL_{3b}$) and nine unit cells 102. FIG. 3A depicts an illustrative READ operation whereby the active portions of the array 50 are depicted in dashed, bolded lines. As shown therein, and as discussed with reference to FIG. 2B above, an appropriate voltage is applied to word line $WL_{2b}$ which generates the read current 41 that passes out of the array 50 on bit line $BL_{2b}$. As mentioned above, this read current 41 can be sensed by traditional read/write circuitry.

FIG. 3B depicts an illustrative PROGRAM operation. As shown therein, and as discussed with reference to FIG. 2C above, a higher positive voltage ($+V_{p1}$) is applied to the word line $WL_{2b}$ than is applied to the word line $WL_{2a}$ ($+V_{ref2}$) and the electrons in the charged nano-crystals 29A in the layer of insulating material 27 of the word line $WL_{2a}$ are removed via Fowler Nordheim tunneling. There is no current flow in the cell 102 during the PROGRAM operation.

FIG. 3C depicts an illustrative ERASE operation. As shown therein, and as discussed with reference to FIG. 2D above, a relatively high negative voltage ($-V_{e1}$) is applied to the all of the word lines in the array 50 while a positive voltage ($+V_{e2}$) is applied to all of the bit lines in the array 50. In this configuration, electrons in the gates of the word lines are injected into the uncharged nano-crystals 29B in the layer of insulating material 27 via Fowler Nordheim tunneling.

As those skilled in the art will recognize after a complete reading of the present application, the RRAM device 100 disclosed herein has a unit cell 102 configuration that is readily adaptable to future scaling. Moreover, since the state of the RRAM device disclosed herein is determined based upon reading current levels, the cell performance does not depend on scaling of gate insulation layers or gate lengths. Thus, the RRAM device disclosed herein presents an attractive alternative to prior art non-volatile memory (NVM) devices where scaling of the gate insulation layer or the gate length on such devices may adversely impact the electrical performance of the prior art NVM devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a charging controlled RRAM device, comprising:
- forming a first word line structure above a semiconducting substrate, wherein forming said first word line structure comprises:
  - forming a first layer of insulating material above said substrate;
  - performing a first ion implantation process to implant a first implant material into said first layer of insulating material;
  - forming a first layer of gate electrode material above said substrate; and
  - patterning said first layer of insulating material and said first layer of gate electrode material;
- forming a second word line structure above said semiconducting substrate adjacent said first word line structure, wherein forming said second word line structure comprises:
  - forming a second layer of insulating material above said substrate and said patterned first layer of gate electrode material;
  - performing a second ion implantation process to implant a second implant material into said second layer of insulating material;
  - performing a heating process to form nano-crystals in said first and second layers of insulating material; and
  - after performing said heating process, forming a second layer of gate electrode material above said substrate;
- forming a first implant region in said substrate proximate said first word line structure, said first implant region defining a first bit line; and
- forming a second implant region in said substrate proximate said second word line structure, said second implant region defining a second bit line.

2. The method of claim 1, wherein, prior to forming said second word line structure, forming at least one sidewall spacer adjacent said first word line structure and thereafter forming said second word line structure adjacent said at least one sidewall spacer.

3. The method of claim 1, further comprising planarizing a surface of said second layer of gate electrode material.

4. The method of claim 1, further comprising patterning said second layer of insulating material and said second layer of gate electrode material to define said second word line structure.

5. A method of forming a charging controlled RRAM device, comprising:
- forming a first word line structure above a semiconducting substrate, said first word line structure comprising a gate electrode and a nano-crystal containing layer of insulating material;
- forming at least one sidewall spacer adjacent said first word line structure;
- after forming said at least one sidewall spacer, forming a second word line structure above said semiconducting substrate proximate said first word line structure, wherein said sidewall spacer is positioned between said first and second word line structures, said second word line structure comprising a gate electrode and a nano-crystal containing layer of insulating material;
- performing at least one first ion implantation process to form a first implant region in said substrate proximate said first word line structure, said first implant region defining a first bit line; and
- performing at least one second ion implantation process to form a second implant region in said substrate proximate said second word line structure, said second implant region defining a second bit line.

6. A method of forming a charging controlled RRAM device, comprising:
- forming a first word line structure above a semiconducting substrate;
- forming at least one sidewall spacer adjacent said first word line structure;
- after forming said at least one sidewall spacer adjacent said first word line structure, forming a second word line structure above said semiconducting substrate adjacent said at least one sidewall spacer;
- forming a first implant region in said substrate proximate said first word line structure, said first implant region defining a first bit line; and
- forming a second implant region in said substrate proximate said second word line structure, said second implant region defining a second bit line.

* * * * *